United States Patent [19]

Saito

[11] Patent Number: 5,523,252
[45] Date of Patent: Jun. 4, 1996

[54] METHOD FOR FABRICATING AND INSPECTING SEMICONDUCTOR INTEGRATED CIRCUIT SUBSTRATE, AND SEMI-FINISHED PRODUCT USED FOR THE SUSTRATE

[75] Inventor: Yutaka Saito, Tokyo, Japan

[73] Assignee: Seiko Instruments Inc., Japan

[21] Appl. No.: 112,618

[22] Filed: Aug. 26, 1993

[51] Int. Cl.$^6$ ................................................. H01L 21/70
[52] U.S. Cl. ................... 437/51; 437/52; 437/7; 437/8
[58] Field of Search ................... 437/51, 52, 7, 437/8; 148/DIG. 162; 257/355

[56] References Cited

U.S. PATENT DOCUMENTS

| | | | |
|---|---|---|---|
| 4,881,113 | 11/1989 | Momodomi et al. | 257/355 |
| 5,038,248 | 8/1991 | Meyer | 257/355 |
| 5,100,822 | 3/1992 | Mitani | 437/52 |
| 5,116,767 | 5/1992 | DeChiaro et al. | 437/8 |
| 5,166,089 | 11/1992 | Chen et al. | 148/DIG. 162 |
| 5,270,565 | 12/1993 | Lee et al. | 257/355 |

Primary Examiner—Tom Thomas
Assistant Examiner—Kevin M. Picardat
Attorney, Agent, or Firm—Adams & Wilks

[57] ABSTRACT

The turn around time required for fabricating a semiconductor integrated circuit from initial conception through packaging may be dramatically reduced by testing the electrostatic integrity of the integrated circuit during fabrication rather than after packaging. In such a method, an electrostatic test device is formed on the same substrate on which the integrated circuit is formed. The test element may or may not comprise a portion of the integrated circuit itself, and a plurality of such test elements may in fact be formed along scribe lines in the wafer. Prior to dicing of individual integrated circuits, the electrostatic withstand capacity of the test element is determined by locating the power required to destroy the test element. The electrostatic destruction withstanding value of the integrated circuit is then derived from the maximum nondestruct power of the test element. Thus, an inspection step for electrostatic withstand capacity may be performed during fabrication, and need not await final packaging.

9 Claims, 14 Drawing Sheets

METHOD FOR FABRICATING AND INSPECTING SEMICONDUCTOR INTEGRATED CIRCUIT SUBSTRATE, AND SEMI-FINISHED PRODUCT USED FOR THE SUSTRATE

BACKGROUND OF THE INVENTION

The present invention relates to a method of fabricating a semiconductor integrated circuit substrate including an insulated-gate field effect transistor element and to a novel semiconductor integrated circuit substrate, and more particularly, to a method of shortening the Turn Around Time (hereafter referred to as TAT) involved in process development by monitoring the electrostatic destruction withstanding value of the substrate.

FIG. 19 shows a typical top plan view of a general terminal configuration of a mold-packaged semiconductor integrated circuit (hereafter referred to as IC). For the IC, the terminals used for connection with an external circuit are roughly divided into the following four types: Vcc terminal 171, ground terminal 172, input terminal 173, and output terminal 174. The semiconductor integrated circuit arrangement comprises these terminals for interconnection to external circuits and an internal circuit for performing a predetermined logical processing and the like. In most applications, an insulated-gate field effect type (hereafter referred to as MOS type) transistor, diode, resistor, and capacitor and the like are integrated as basic components of an integrated circuit device.

For facilitating understanding of the present invention, a MOS transistor associated with a terminal section is particularly called a peripheral transistor and that associated with an internal circuit is called an internal transistor. One of the more important reliability factors for ICs is the electrostatic destruction withstanding value (hereafter referred to as ESD withstanding value). This is a value specified by EIAJ, and requires that ICs must withstand against an ESD stress of a machine model of approx. 200 pF, 250 V.

FIG. 20 shows a typical circuit schematic diagram for an ESD stress test. In this case, a state is shown in which +250 V of the GND standard is applied. After the voltage is applied, the leakage current of each of the terminals and that between the power supply terminals are measured. FIG. 21A is a graph showing the relationship between ESD stress and leakage current of each of the terminals after stress is applied. A current originally of a μA order increases in accordance with applied stress voltage. The current suddenly increases at the point where stress voltage exceeds a certain value, a point, for example, where the leakage current exceeds 1 μA is decided as the ESD withstanding value.

FIG. 22 shows a typical block diagram of a general input-terminal protective circuit. The N-channel MOS transistor 201 is the one which performs a function for protection against an ESD stress as a so-called off-transistor. Details of such a device are described in Japanese Patent Application No. 048876-1992. FIG. 23 shows a typical block diagram of a general N-channel open drain output terminal.

In recent years, the remarkable decrease of the ESD withstanding value of N-channel MOS transistors used for the open drain output has become a problem because ICs have been made in extraordinary high density. The structural dependency of ESD withstanding voltage in transistors and improvement measures therefor are also shown in Japanese Patent Application No. 048876-1992. The structure described therein includes a structure to be settled by such as thickness of a gate insulated film and concentration of an impurity area in the fabrication step and that to be settled by planar dimensions and arrangement, which is design rule like. In the present invention, however, the both structures are generally called a process menu or process.

FIG. 24 shows another typical block diagram of a protective circuit for an N-channel open drain output terminal. FIG. 25 shows a typical block diagram of a protective circuit for a CMOS output terminal. FIG. 26 shows a block diagram of a protective circuit for an input/output terminal. Various input/output terminals have been explained above, however, it is understood that ICs are generally provided with an N-channel MOS transistor in recent years. Description is continued hereinafter in consideration of this fact.

FIG. 17 is a flow chart showing the design and development of a general IC. Description herein is made with reference to the flow chart. First, a process to be used (the process here includes design rule) is selected according to the project of the new IC taking into consideration whether various processes can produce an IC having the necessary performances and whether it can be fabricated in a desired chip size using such processes. Then, a circuit is designed according to the above consideration. Then, a prototype is fabricated in the trial production step. Then, the performances and characteristics are measured and evaluated. In this case, an ESD test is performed simultaneously with an endurance test or the like. Then, unless the prototype meets the specification, it is rejected and process selection and circuit design are tried again on a trial and error basis. Normally, six months to one year are necessary for one cycle even if no trouble occurs. If the prototype is rejected in the ESD test, an additional six more are necessary in the case where planning is carried out from the circuit design step. The fact that the ESD withstanding value is not accurate until the final stage of product development is a serious problem, in that it has a critical influence on the TAT which is already too long, even under normal conditions.

FIG. 18 shows a flow chart of a general process development. Although process development refinement is not limited to the case of increasing circuit density and speed, such a development cycle is shown in FIG. 18. First, a design rule is temporarily set. Then, a fabrication step is set, a photomask for only a test pattern dedicated to development (frequently called TEG) is designed, and a prototype is fabricated in the fabrication step. For a finished semiconductor wafer, various electrical characteristics are carefully measured, evaluated, and judged. Unless there is any resulting problem, the design rule and fabrication step are approved and released to the circuit design group. In general, satisfactory results are not obtained in the fabrication of a prototype in the fabrication step and therefore modification of the design rule or modification of the fabrication step is required. It is normally repeated three or four times depending on the degree of circuit complexity. The TAT for development of a new process generally requires at least 1 to 3 years. Therefore, when a product is developed using a new development process but fails the ESD test in the final step, this results in disastrous consequences because the process development must be started over from the beginning stage, and the cause of the problem must be determined. In this case, the TAT may undesirably require several years.

Even in an already-released IC, there may be a product which frequently causes a problem in a market or field because there was originally no margin in the ESD withstanding value when the product was designed. Also, there may be a product which accidentally passes the ESD test in qualification for a new product and whose ESD withstanding value is proved to be insufficient due to the subsequent processing in the fabrication step after mass production of the product starts. There may be a problem in the process menu or in the circuit design and the like of the product. In any case, design and development must be performed a new because it is impossible to sort the products through the ESD test after they are mass-produced and packaged. During the period of redesign, shipping of such defective products is generally stopped. Therefore, this has caused a large, industry-wide problem.

SUMMARY OF THE INVENTION

By considering the above problems of the prior art, it is an object of the present invention to detect the ESD withstanding value of an IC in the early stages of process development, before mass production. Before describing the means used to achieve the object, the technical background is roughly described by referring to the drawings. FIG. 10 is a typical graph showing the relationship between ESD withstanding value of an IC and that of a transistor which is one of the components of the IC. The ESD withstanding value described here can be considered as the ESD withstanding value of each terminals of an packaged and finally-finished IC as previously described. The ESD withstanding value of the transistor represents the ESD withstanding value measured by directly applying a probe to a single independent test transistor formed on the same wafer when the IC is in wafer state before it packaged. FIG. 21B is a graph showing leak current between source to which gate is connected after stress application against ESD stress applied to a simple test transistor (e.g. drain voltage, $V_{D-S}$, is 5 V). This trend is as same as that of IC mentioned above. The curve of leak current against ESD stress is very available for evaluating ESD withstanding value of transistor by structure. It is clarified in the research report by the invention (refer to the 40th semiconductor integrated circuit technology symposium in 1991) that there is a correlation between IC and test transistor on ESD withstanding value. In this connection, incidentally, for example, when it is made that the width W (gate width) of the transistor used for the open drain output of an IC is 400 μm and the width W of a test transistor is 25 μm, there is a certain difference between the absolute values of the ESD withstanding values of the both transistors. What is said in this case is that there is a proportional relation. Naturally, it is not easy to measure the ESD withstanding value with the test transistor on the wafer as the same way with the evaluation of the ESD withstanding value of the IC. Because an exclusive ESD simulator is necessary and also careful calibration and correlation of a measuring system is necessary. Actual measurement also requires a lot of time because stress application and leak measurement are alternately repeated.

FIG. 4 shows a typical sectional view of an N-channel MOS transistor. A source (S) 31, drain (D) 33, and gate electrode (G) 32 are arranged on the surface of a P-type substrate 30.

FIG. 5A and FIG. 5B show typical equivalent circuit diagrams of an N-channel MOS transistor. As shown in FIG. 5A and FIG. 5B, the N-channel MOS transistor can be equivalently considered as an NPN bipolar transistor. In FIG. 5A, the gate electrode is connected to the source and is in off state. When an ESD stress is applied under this state, the NPN bipolar operation is performed so as to release the ESD stress. This is also shown in Japanese Patent Application No. 048876-1992.

FIG. 6 is a graph of a typical $V_D$-$I_D$ characteristic showing the state where bipolar operation is caused through snapback of the N-channel MOS transistor. This graph does not show a transient phenomenon when the ESD stress is applied, but it shows a DC-like phenomenon. That is, as previously described, $I_D$ (drain current) is plotted by making the gate into off-connection and by making $V_D$ (drain voltage) raise. When $V_D$ is going to raise, drain avalanche breakdown (1st breakdown 51) first occurs and then the voltage lowers due to the snapback 52. The bipolar operation current 53 of the NPN transistor flows. When application of current is further continued, 2nd breakdown 54 occurs which is the so-called bipolar secondary breakdown and the voltage further lowers due to the snapback (2nd snapback 55). When application of current is further continued, 2nd bipolar current 56 flows. In this case, $V_D$ and $I_D$ at which the 2nd breakdown starts are made as (V2, I2) 57, respectively.

FIG. 7A is obtained by rewriting FIG. 6, which is a typical graph showing the relationship between P (power), that is the product of $I_D$ and $V_D$, and $I_D$. The 1st bipolar operation area 61 is a reversible phenomenon area and the 2nd bipolar operation area 62 is an irreversible phenomenon area. That is, the expression "irreversible" here represents that a transistor causes permanent destruction. In this case, the above V2 and I2 correspond to the pole changing point Pmax 63. As shown in FIG. 7A, the point is called Pmax because it shows the maximum product (power) of $V_D$ and $I_D$ in this phenomenon. Although it has been described as common idea of measuring electric value that current is measured by voltage supply, it is actually available that voltage is measured by current supply. Measurement by only voltage supply is impossible in fact because of snapback. Generally, an equipment called Source Measure Unit (SMU) is available because current value or voltage value is measured by supply of appointed voltage or appointed current. Further, applied definite current has to be applied like as increasing by steps against time (called ramping up) because the measurement is the measurement of an irreversible phenomenon. FIG. 8A is a typical graph showing the relationship between time and supply current for explaining this process. Current apply by steps is shown in the graph. About time steps, the most suitable value is chosen according to transistor size or process, which ranges in time from micro second to second. FIG. 8B is a typical graph showing the relationship between time and supply current for explaining the process of logarithmic current supply. Current apply is increased against time logarithmically not proportionally. This process make it possible that current value of wide range from drain avalanche breakdown of snapback phenomenon to 2nd breakdown is measured efficiently.

FIG. 11 is a typical graph showing the relationship between pmax defined in the present invention and previously-mentioned ESD withstanding value of transistor. From FIG. 11, it is found that there is a univocal correlation between them. In general, the area of safety operation (ASO) of a bipolar power transistor, particularly the electric energy (power) at the time of snapback PSB as the one for explaining the so-called secondary destruction phenomenon which decides pulse ASO is defined as following.

$$P_{SB} = \int_0^{td} VI \, dt$$

This is called triggering energy. In the above expression, "td" is a delay time until secondary destruction occurs (total time passing through the 2nd snapback point). However, the ASO is regarded as the one which is in inverse proportion to PSB (refer to "Power transistor/power IC and its practical use" by Seiichi Tsuteda). This seems to be inconsistent with the correlation between Pmax defined in the present invention and the ESD withstanding value of transistor but it is a completely different phenomenon. As previously described, the bipolar operation operates so as to release an ESD stress when the stress is applied to a MOS transistor. The stress is consumed (released) by the bipolar operation current 53 of the NPN transistor in FIG. 6, and Pmax is a substitute characteristic for accurately showing the degree of the stress. The pulse ASO of the bipolar power transistor is deteriorated by passing through $P_{SB}$, and how much it passes through $P_{SB}$ was a problem (transistor with stronger ASO has smaller $P_{SB}$). Therefore, the concept of Pmax in the present invention is very fresh and the attempt to deduce the ESD withstanding value of a transistor and, in its turn, the ESD withstanding value of an IC is a very fresh method among those for fabricating a semiconductor integrated circuit arrangement.

FIG. 9 is a typical graph showing the relationship between Pmax of the present invention and ESD withstanding value of IC, which is an experiment result of the above attempt. Pmax is obtained by measuring a test transistor formed on the same wafer with an IC in a wafer state, and the ESD withstanding value of the IC is measured in the form of a final package. From FIG. 9, it is found that there is a univocal correlation.

To achieve the above object, the present invention uses the following means.

The means comprises a semi-finished product fabrication step for forming a semiconductor integrated circuit and a component evaluation area of the semiconductor integrated circuit on the same substrate and, by following it, an inspection step for electrically evaluating the component evaluation area of the semiconductor integrated circuit;

wherein an electrostatic destruction withstanding value evaluation element is formed in the component evaluation area of the semiconductor integrated circuit to measure the destruction power of the electrostatic destruction withstanding value evaluation element in the inspection step.

For measurement of the destruction power of the electrostatic destruction withstanding value evaluation element, various levels of voltages ranging from nondestructive state to destructive state are applied to the element, the power consumed by the element is measured by the applied voltages and currents flowing through the element, thereby the power value at the time of the maximum nondestructive voltage is obtained to decide whether or not the power value is proper by making the obtained value as the electrostatic destruction withstanding value of the semiconductor integrated circuit substrate. The electrostatic destruction withstanding value evaluation element is formed in the vicinity of the semiconductor integrated circuit formed on the substrate or at a proper position on the substrate.

Further, measurement of the power has steps applying definite current increasing by time steps to the element, measuring voltage at the time and obtaining a power value.

Further more, measurement of the power has steps applying definite current increasing by logarithmic time steps to the element, voltage is measured at the time, and the power value is obtained.

When the power value reaches the prescribed value, voltage supply is stopped and it is decided whether or not the power value is in the nondestruction area.

Further, a method for fabricating a semiconductor integrated circuit substrate has a process which semiconductor integrated circuit is formed on the substrate and has an inspection step which the semiconductor integrated circuit is evaluated electrically. The inspection step includes the measurement of destruction power deduced electrostatic destruction withstanding value.

Further, the measurement of destruction power has a step which voltage is applied to a part of the semiconductor integrated circuit, a step which voltage apply is stopped when the power value consumed on the part of the semiconductor integrated circuit by voltage and current therein reaches the prescribed value, and a step which it is decided whether or not the power value is in the nondestruction area.

Further, measurement of the power has steps which definite current increasing by time steps is applied to the element, voltage is measured at the time, and the power value is obtained.

Further more, measurement of the power has steps which definite current increasing by logarithmic time steps is applied to the element, voltage is measured at the time, and the power value is obtained.

The following functions are obtained by using the above means. First, a brief description is made below by referring to drawings. FIG. 12 is the one in which the relationship between each parameters is arranged. Pmax of a transistor is determined by a fabrication step or a process menu such as a design rule to univocally determine the ESD withstanding value of the transistor and also determine the ESD withstanding value of a finished IC. In this case, the design rule come to participating again. Thus, it is possible to deduce the ESD withstanding value of an IC by Pmax. It is very fresh that a reliability such as ESD which cannot be originally known before the IC is packed can be deduced by Pmax which can be easily measured in DC similarly to $V_{1h}$ so that just as the IC yield is deduced by measuring the threshold voltage ($V_{1h}$) and conductance (gm) of a transistor. This is very significant in view of TAT, quality assurance for shipping, and decrease in cost by a fabrication method which sending no defective product to the next step.

Concrete functions are listed below. The first function is that the TAT related to evaluation of ESD withstanding value for development of a process can be greatly shortened.

The second function is that the TAT for fabrication of a new product can be greatly shortened.

The third function is that, the quality related to the ESD withstanding value of mass-production products can be sorted in the fabrication step and products can be shipped.

DESCRIPTION OF THE PREFERRED EMBODIMENT

Figure 1:
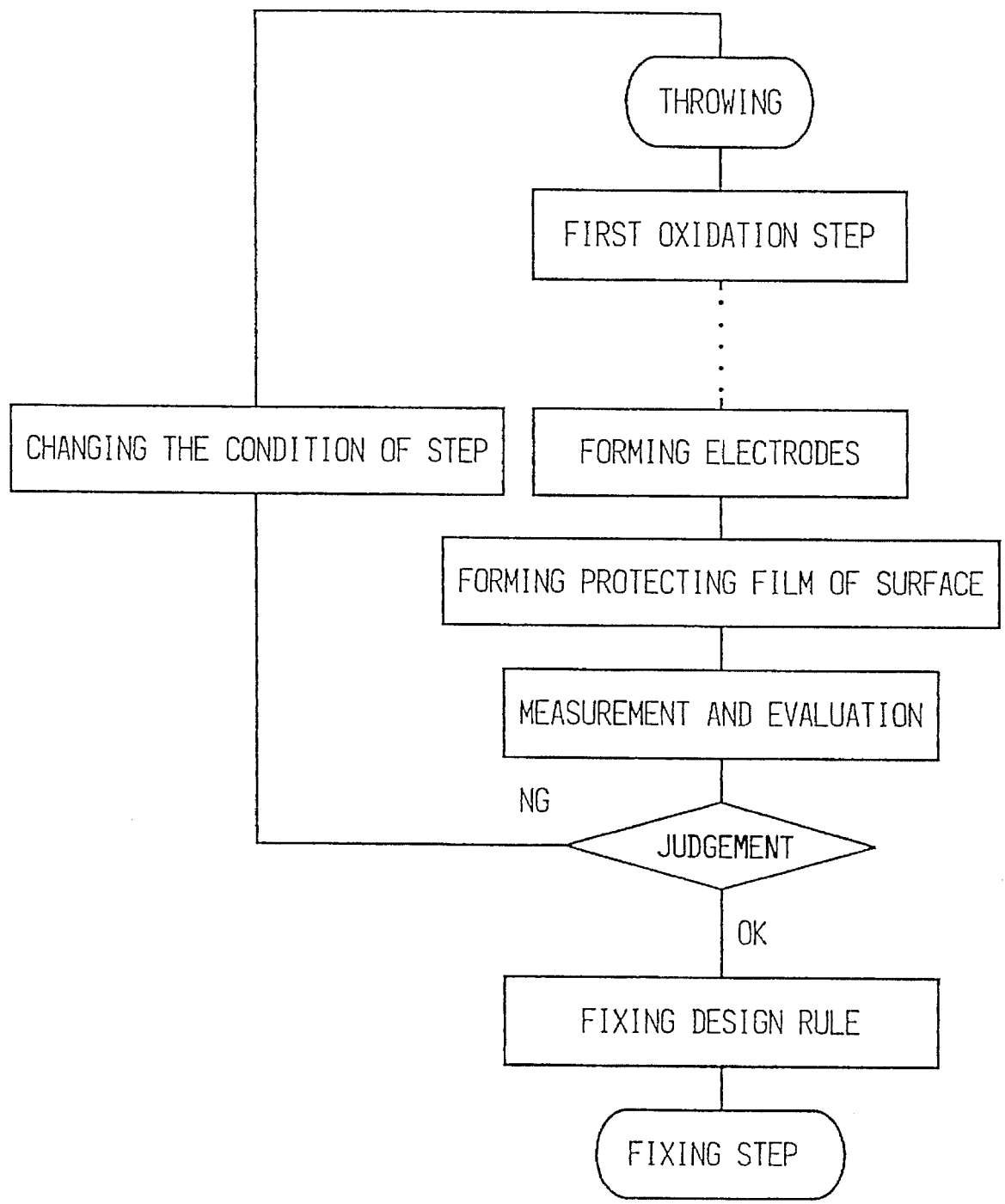
FIG. 1 is a typical flow chart of experimental process development showing the first embodiment of the present invention.

FIG. 1 is a typical flow chart of experimental process development showing the first embodiment of the present invention. As shown in FIG. 1, by using a photomask for only a test pattern exclusive for development (TEG), it starts from the first oxidation step, and the semiconductor fabrication step are the same as those of the prior art. However, the present invention is greatly different from the prior art in the point of forming a photomask for a component evaluation area to be described later in addition to a desired photomask for an integrated circuit.

Thus, a component evaluation area is formed on a substrate in addition to an integrated circuit. Then, it enters into the measurement and evaluation steps, where Pmax of a transistor is measured for the component evaluation area in addition to conventional general evaluation items (e.g. $V_{1h}$, gm, leak current and the like).

Experimental manufacture can be immediately performed again by estimating the ESD withstanding value at the time it became IC according to the value of Pmax and changing the step conditions if there is a problem. It is also possible to determine a design rule related to an ESD withstanding value most properly by measuring Pmax of transistors with various plane dimensions in TEG. Conventionally, a long TAT is required because the ESD withstanding value is not known until fabrication of the first prototype using a newly developed process is completed. However, the present invention makes it possible to complete the performance and quality related to the ESD withstanding value in the process of development cycle.

Figure 2:
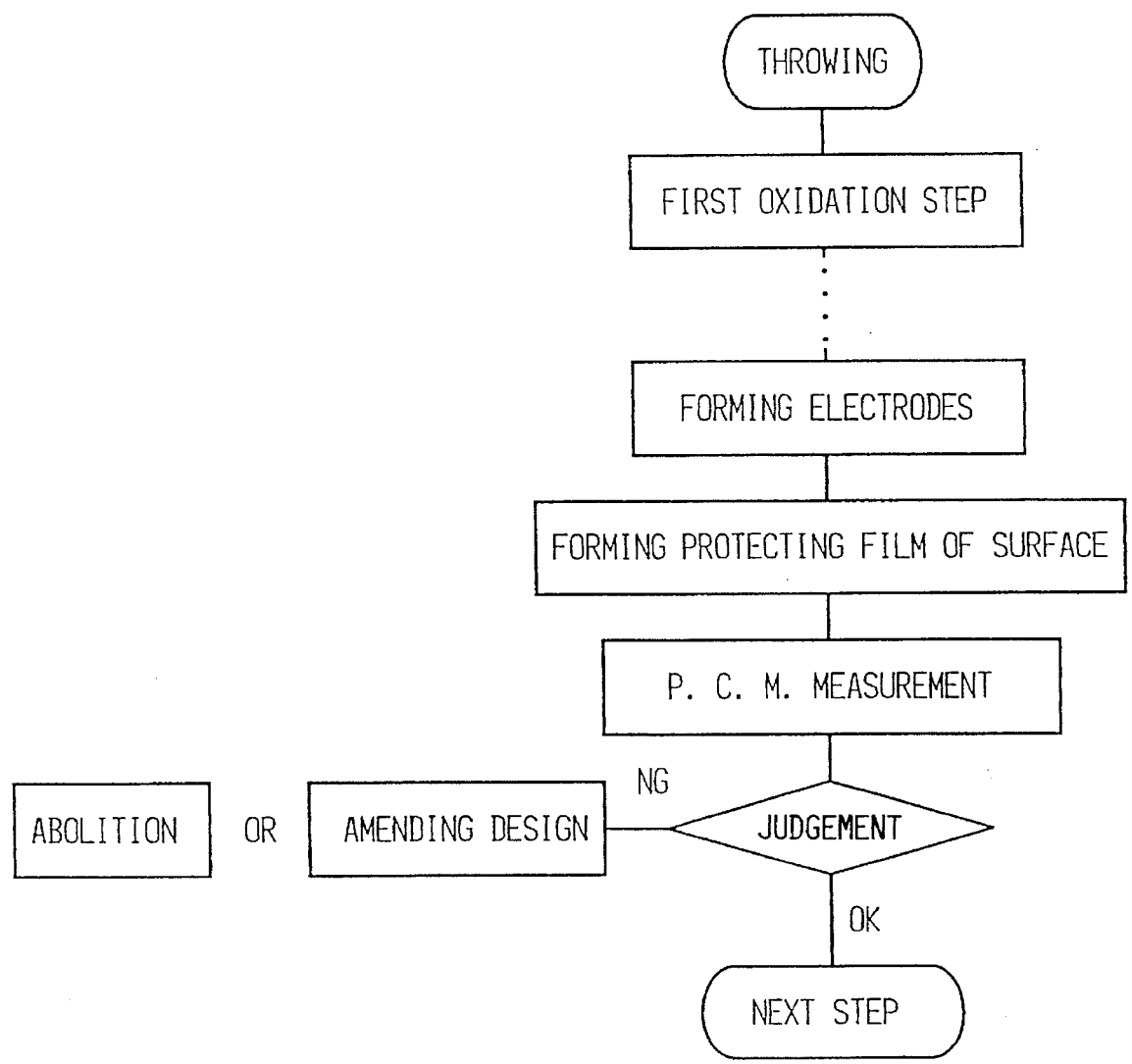
FIG. 2 is a typical flow chart of the fabrication step of a prototype and mass-production IC showing the second embodiment of the present invention.

FIG. 2 is a flow chart of the fabrication steps of a prototype and mass-production IC showing the second embodiment of the present invention. As shown in the figure, normal semiconductor fabrication steps are continued after starting with the first oxidation step. In the PCM (Process Control Monitor) measurement step at the final stage, $V_{1h}$, gm, leak current, and various resistance values of a normal transistor are measured to make NO/GO judgment of a semiconductor wafer. This is because it is waste to sent a wafer not to contribute to the yield due to a trouble to the subsequent tester step. This embodiment is characterized by measuring not only $V_{1h}$ but pmax through the PCM measurement. The ESD withstanding values of end products in the form of a package are estimated according to the value of Pmax. If a problem is found, verification and correction of design regarding circuit or layout are performed when the product is a prototype. However, if the product is a mass-produced product originally having no margin in the ESD withstanding value, it is screened on the spot. Conventionally, every product has been performed the ESD test after making them packaged and the qualification of new product and NO/GO judgment for shipping have been performed.

Figure 3:
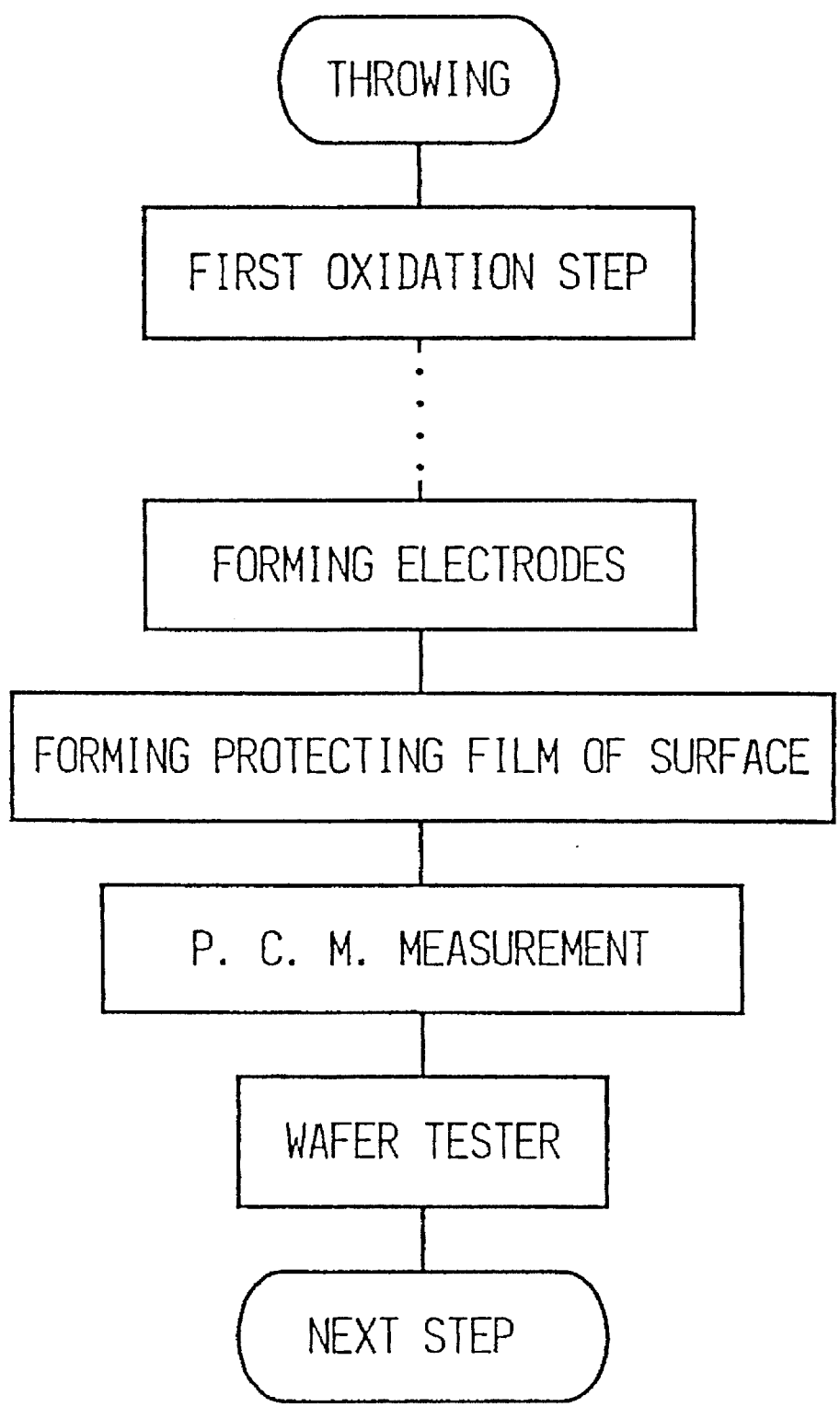
FIG. 3 is a typical flow chart of the fabrication step of a prototype and mass-production IC showing the third embodiment of the present invention.
Figure 4:
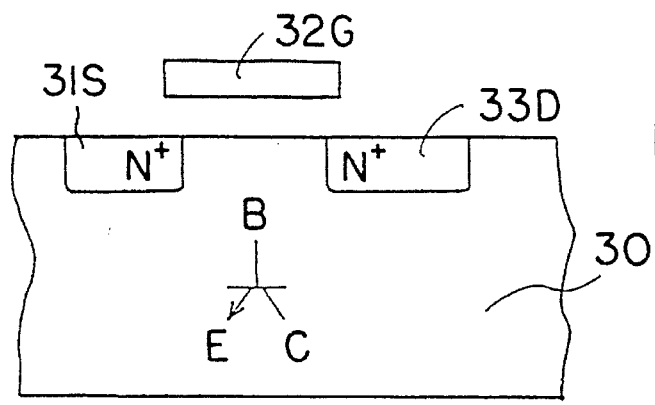
FIG. 4 is a typical sectional view of an N-channel MOS transistor.
Figure 5A:
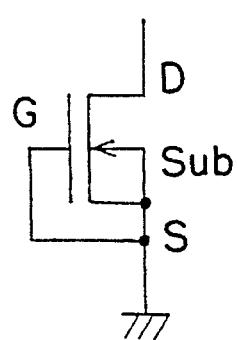
FIG. 5A is a typical equivalent circuit diagram of an N-channel MOS transistor and FIG. 5B is a typical equivalent circuit diagram showing the case regarding as a bipolar transistor.
Figure 5B:
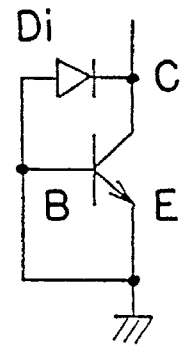
Figure 6:
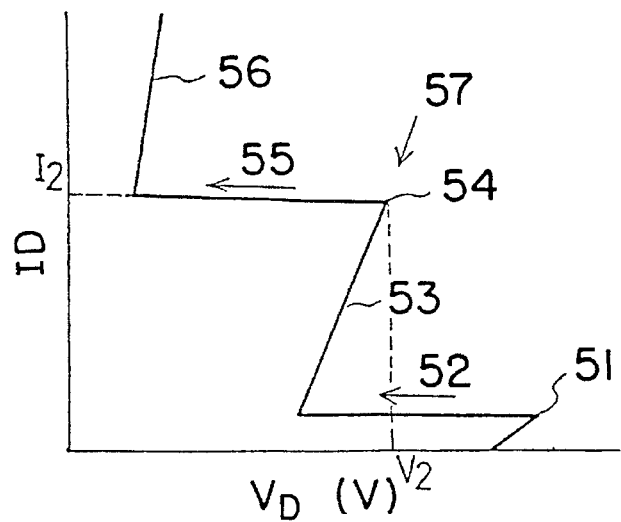
FIG. 6 is a graph of a typical $V_D$-$I_D$ characteristic showing the state in which the bipolar operation starts through snapback of an N-channel MOS transistor.

FIG. 3 is a typical flow chart of the fabrication step of prototype and mass-production IC showing the third embodiment of the present invention. The measurement of Pmax is not done in the process of PCM measurement and done in the wafer tester process after PCM measurement. The process is good for the case which the measurement of Pmax is impracticable for reasons of instrument (current applying is impossible) and for the case which ESD withstanding value of all product chip is guaranteed. The wafer tester process means the process which electrical efficiency of many real product chip arranged on semiconductor wafer not PCM is checked, product chip which does not meet the appointed efficiency is marked by laser or ink as a bad product, and product chip which is selected (called screening) not to proceed to next package process. The process is called sorting, wafer sorting, probing, or wafer probing. In this embodiment, ESD withstanding value is checked at the terminal of input, output, or input-output on the real product IC not the measurement of Pmax on the test transistor like PCM. The measurement of Pmax is also possible, but the arrangement of test transistor in the product chip is mentioned below.

As product IC chip is real product, any terminal must not be destroyed. The product IC or process needs beforehand statistical, actual Pmax. The power value which is between Pmax and ESD withstanding value is determined, it is called Pcrit. $I_D$ which gets Pcrit is called $I_{Dcrit}$. $I_{Dcrit}$ is applied to the terminals of product IC chip and the power is measured. If the power value is more than Pcrit value, the product IC chip is decided to be a good product. If it is not, it is marked as no good product similarly in the case of electrical efficiency check. So, product IC is not destroyed by the measurement of Pcrit, not Pmax which exceed irreversible destroy.

Figure 7A:
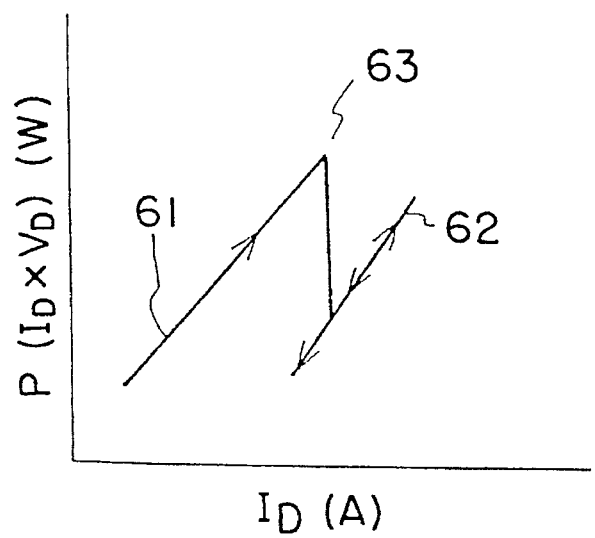
FIG. 7A is a typical graph showing the relationship between P (power), that is a product of $I_D$ and $V_D$, and $I_D$, which is obtained by rewriting the graph in FIG. 6.
Figure 7B:
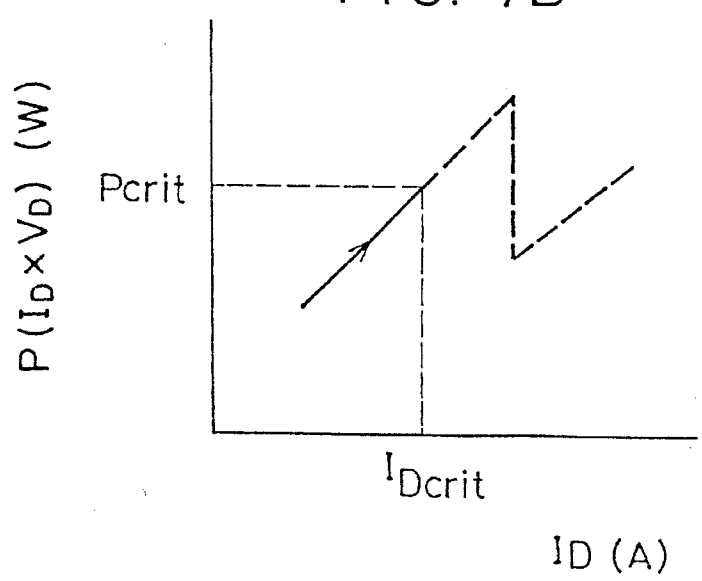
FIG. 7B is a typical graph showing a product of $I_D$ and $V_D$, and $I_D$ for explaining Pcrit.
Figure 8A:
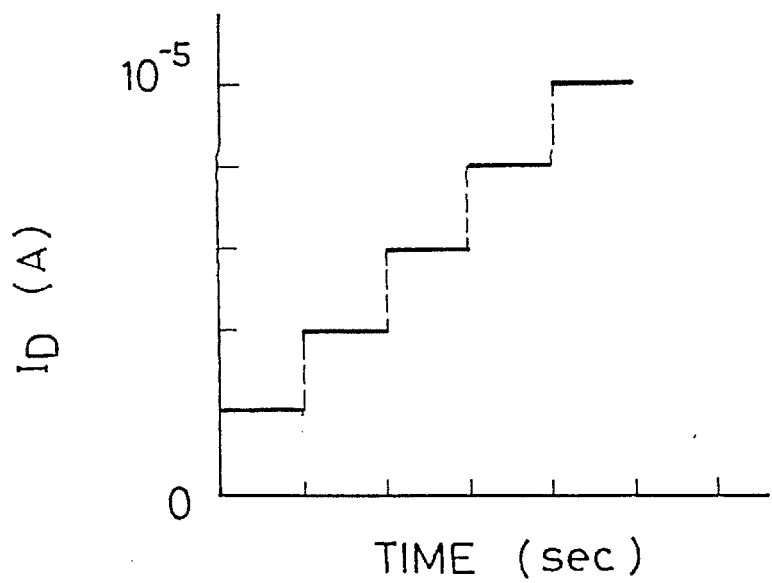
FIG. 8A is a typical graph showing the relationship between time and current for explaining the method of current apply.
Figure 8B:
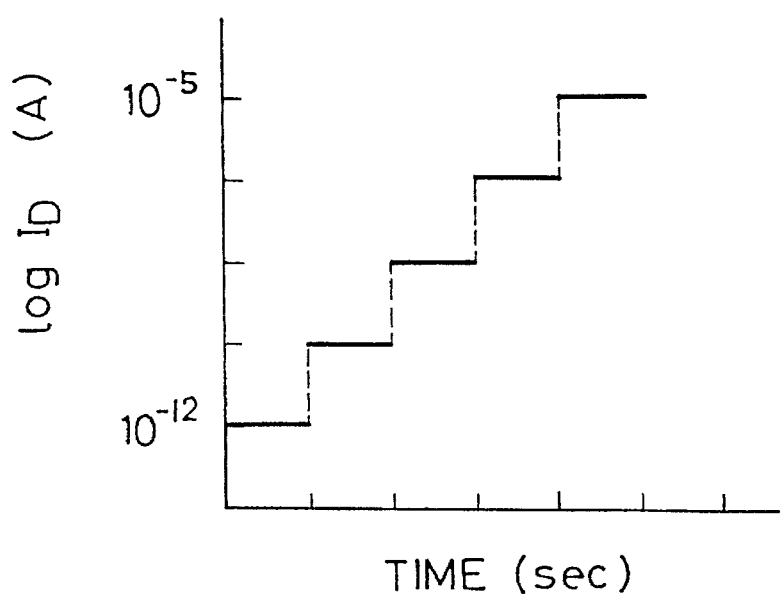
FIG. 8B is a typical graph showing the relationship between time and current for explaining the method of logarithmic current apply.
Figure 9:
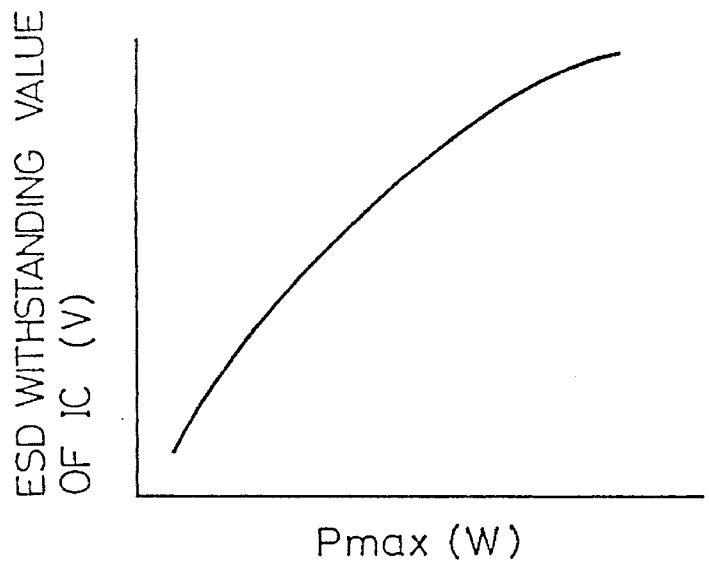
FIG. 9 is a typical graph showing the relationship between Pmax of the present invention and ESD withstanding value of IC.
Figure 10:
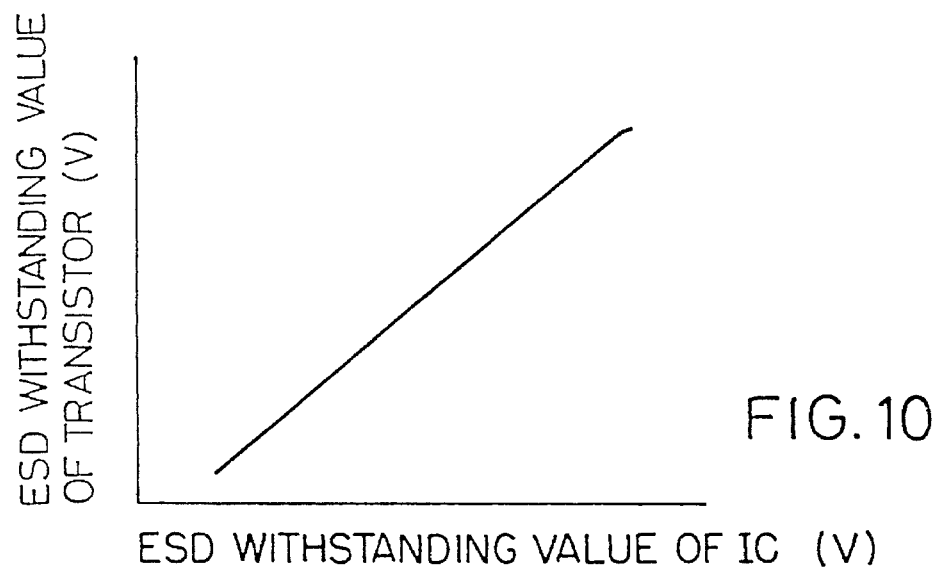
FIG. 10 is a typical graph showing the relationship between ESD withstanding value of an IC and that of a transistor.
Figure 11:
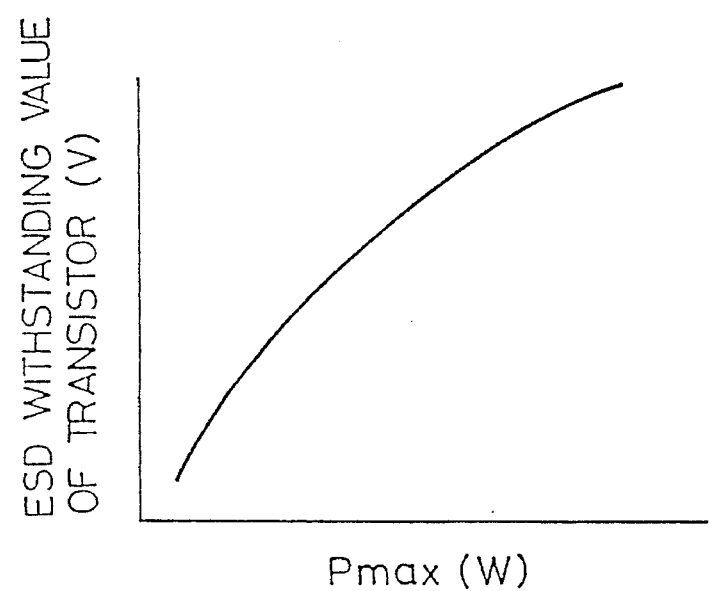
FIG. 11 is a typical graph showing the relationship between Pmax defined in the present invention and ESD withstanding value of the above-mentioned transistor.
Figure 12:
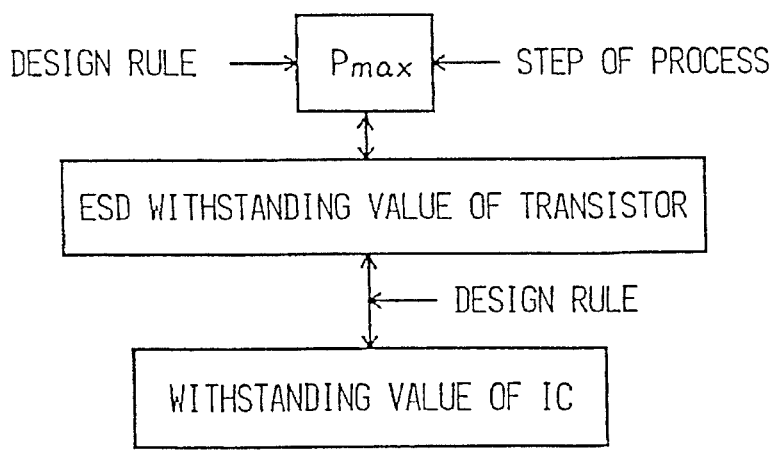
FIG. 12 is a typical illustration in which the relationship between each parameters is arranged.

FIG. 7B is a typical graph showing the relationship between a product of $I_D$ and $V_D$, and $I_D$ for explaining Pcrit. In this embodiment, the measuring time is shorter than that of Pmax. In the first and second embodiments, it is also useful to measure Pcirt instead of Pmax.

The present invention makes it possible to greatly shorten the TAT and improving of the quality and decreasing of the cost can be realized owing to the fact that a defective IC can be previously screened. The following is a brief description of the above PCM.

Figure 13:
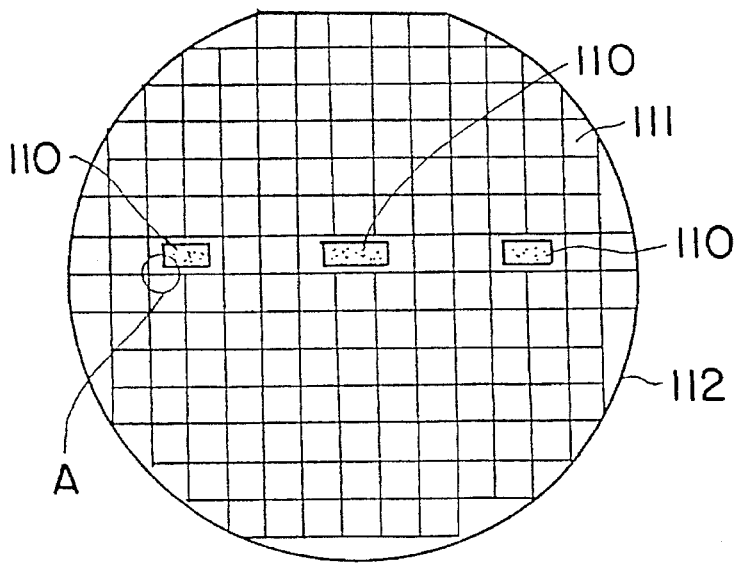
FIG. 13 is a typical plan view showing a semiconductor wafer on which IC as a product and PCMs are arranged.

FIG. 13 shows a typical top view of a semiconductor wafer (semiconductor integrated circuit substrate) 112 on which product ICs (semiconductor integrated circuit) and PCMs (semiconductor integrated circuit component evaluation area) 110 are arranged. In general, several to several tens of PCMs are thus arranged between product ICs 111 on one wafer. For a large IC, PCMs may be formed in the IC chip.

Figure 14:
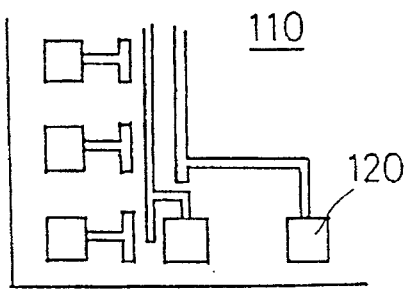
FIG. 14 is a typical plan view showing the enlarged portion A of a PCM.

FIG. 14 is a typical plan view showing the enlarged portion A of the PCM 110, in which there are pads 120 for probing and separated transistors of single substance are arranged with variation of several types of dimensions (e.g. gate length and gate width W). Pmax is measured by probing these pads as in the wafer state as it is, similarly to the measurement of $V_{1h}$.

Figure 15:
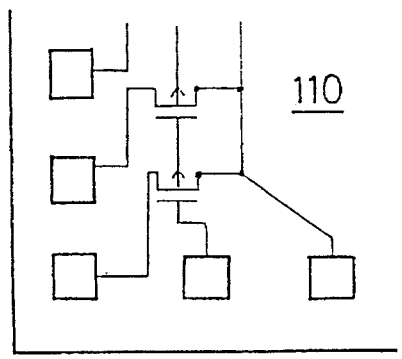
FIG. 15 is a block diagram showing a typical circuit at the portion A of a PCM.

FIG. 15 is a block diagram showing a typical circuit at the portion A of the PCM 110. In addition to the arrangement of the PCM 110 previously described, there is a method for arranging slender PCMs on a scribing line (cutting margin between ICs).

Figure 16A:
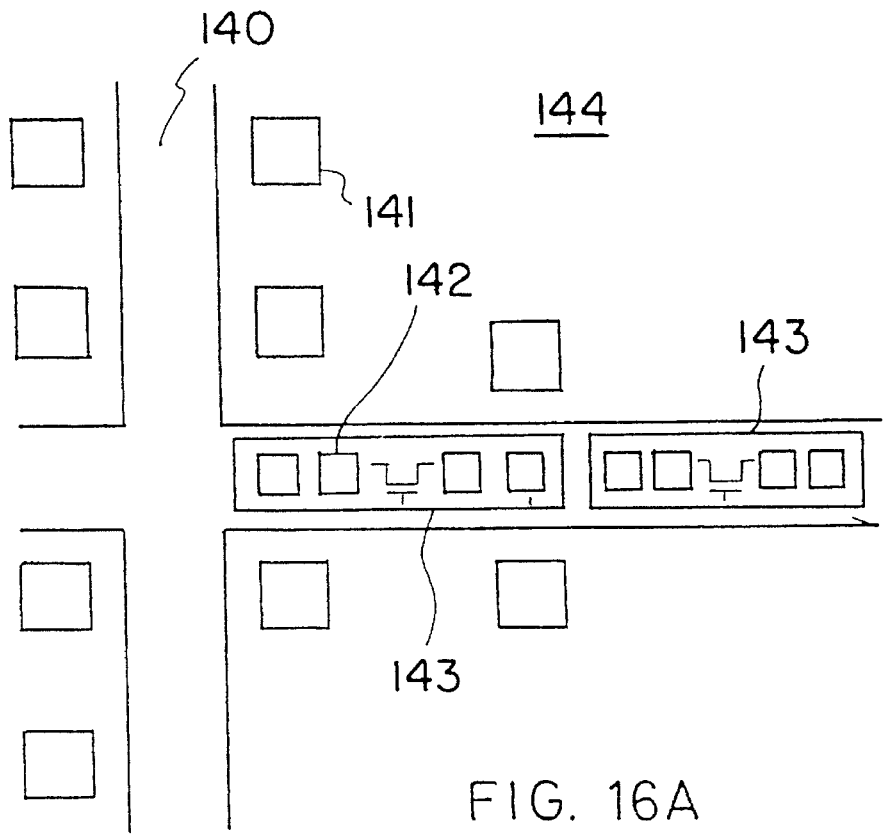
FIG. 16A is a typical plan view showing the situation in which PCMs are arranged on a scribing line.

FIG. 16A is a typical plan view showing the situation where PCMs 143 are arranged on a scribing line 140. Bonding pads 141 are arranged around a IC chip 144 as a product. The IC chip 144 as a product is partitioned by the scribing line 140. This method has an advantage that the number of IC chips 144 as a product to be able to obtain does not decrease. Measurement of Pmax is similarly performed. The number of chips to be measured and the sampling method are depended on the situation similarly to the case of $V_{1h}$ and the like, for which a person who embodies the present invention should make the best use of his long-time experience on quality control and statistical techniques.

For the present invention, the semiconductor integrated circuit substrate comprises an IC serving as a semiconductor integrated circuit and a PCM serving as a semiconductor integrated circuit component evaluation area, which is a finished semiconductor wafer in general. However, when the PCM is included in the IC, the IC directly serves as the semiconductor integrated circuit substrate.

Figure 16B:
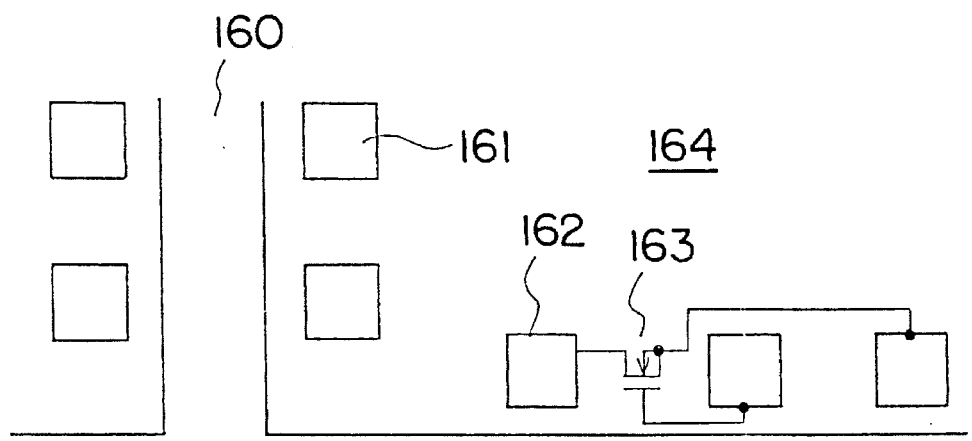
FIG. 16B is a typical plan view showing the situation in which a test transistor is arranged in a chip.
Figure 16B:
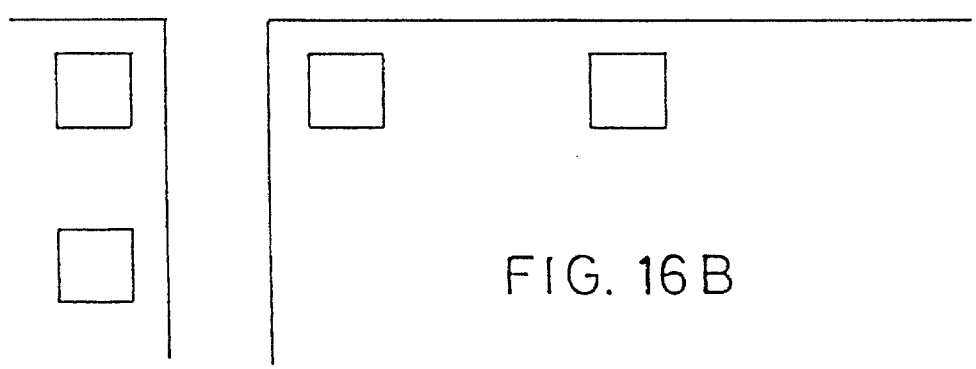
Figure 17:
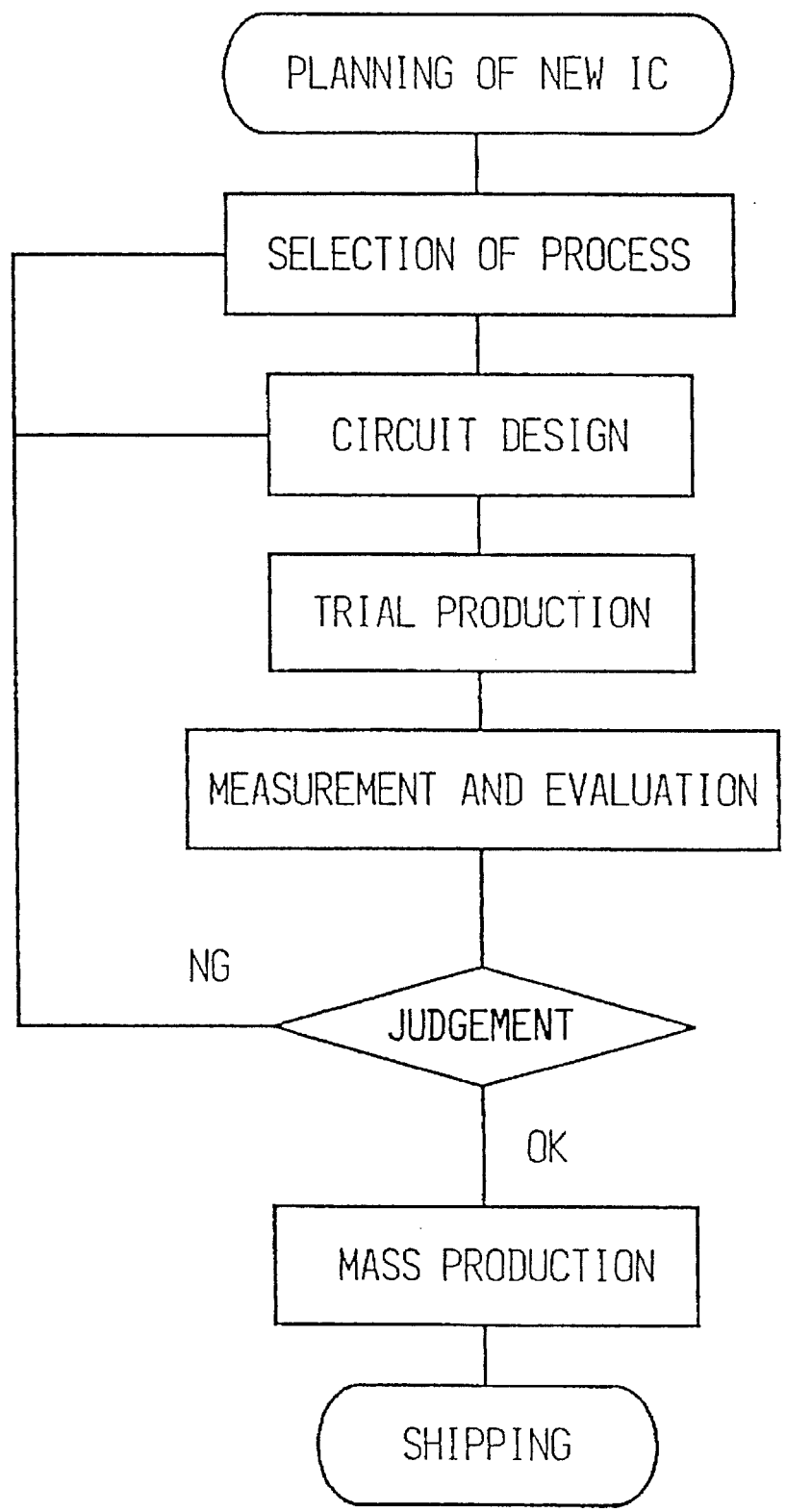
FIG. 17 is a typical flow chart showing general development of new IC.
Figure 18:
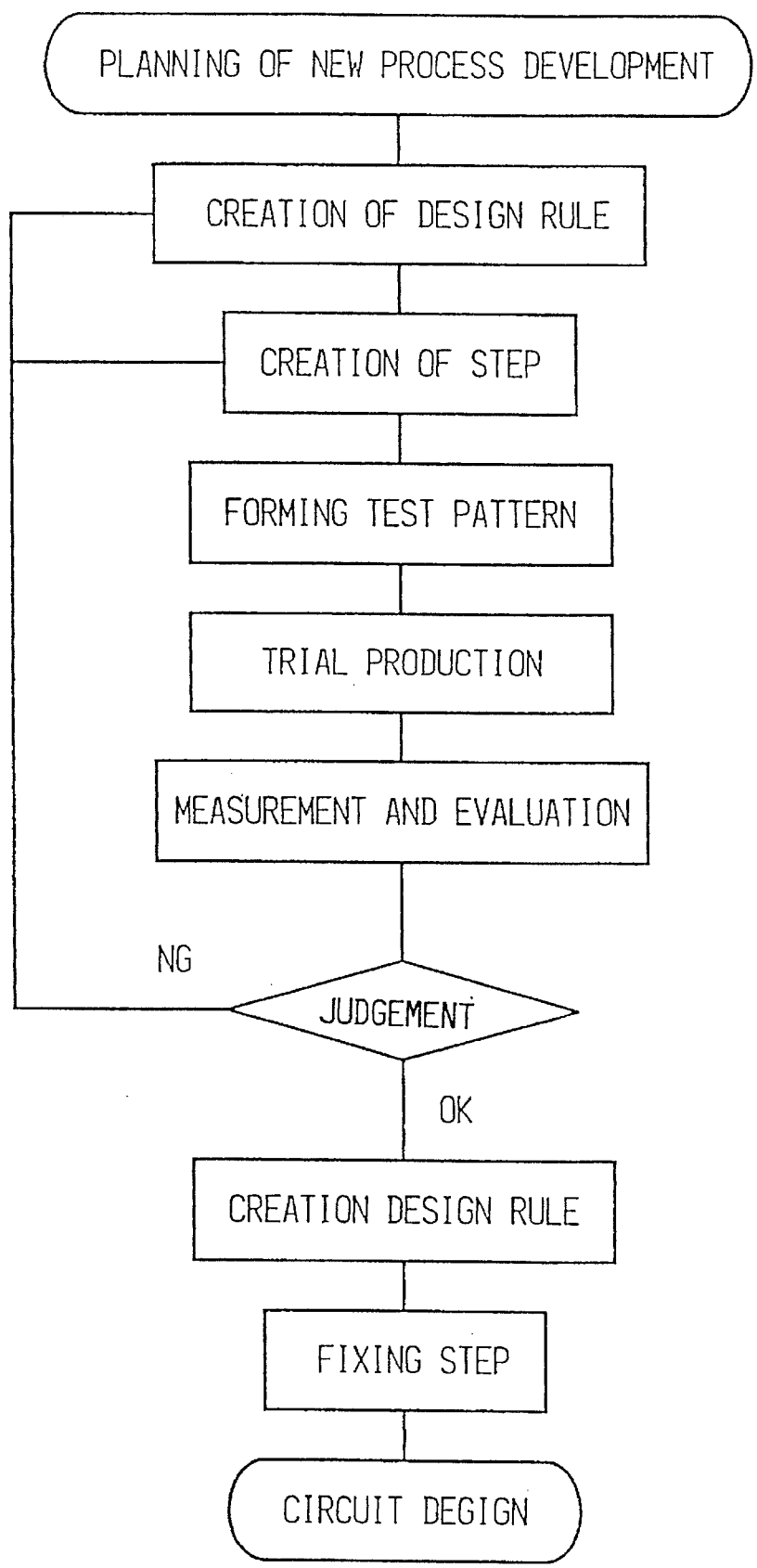
FIG. 18 is a typical flow chart showing general process development.
Figure 19:
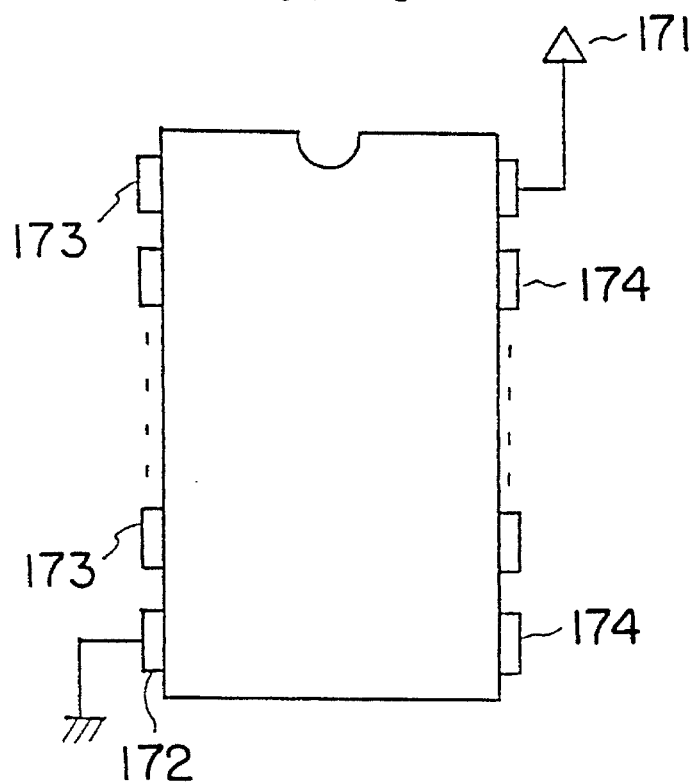
FIG. 19 is a typical top view showing a general terminal configuration of a mold-packaged semiconductor integrated circuit arrangement (hereafter referred to as IC)
Figure 20:
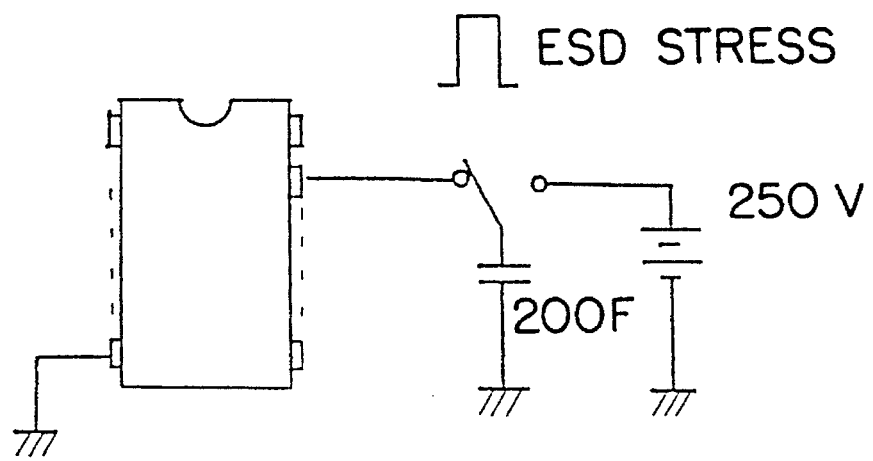
FIG. 20 is a typical Circuit diagram showing an ESD stress application test.
Figure 21A:
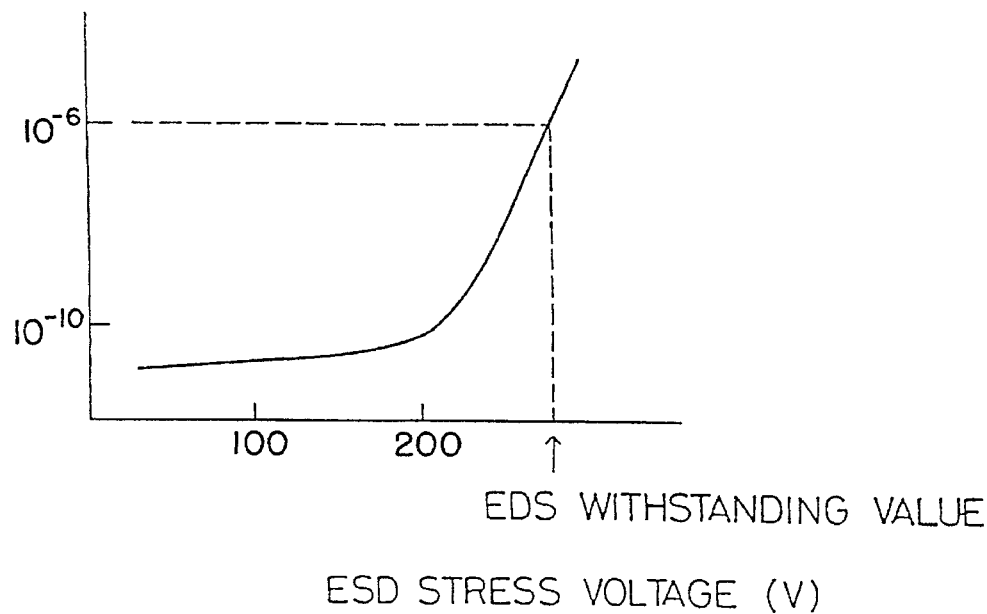
FIG. 21A is a graph showing the relationship between ESD stress and leak current of each terminals in IC after application of stress.
Figure 21B:
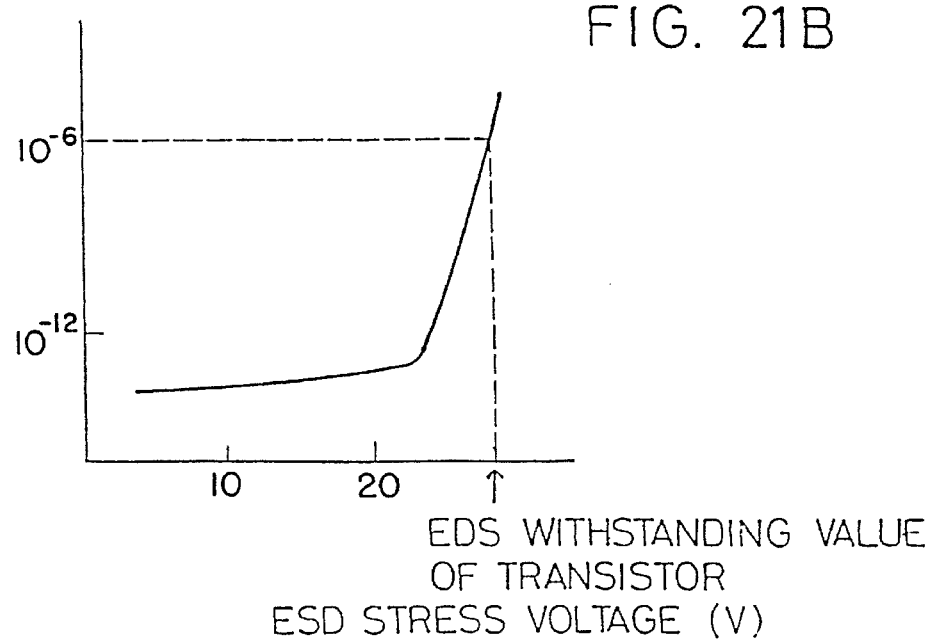
FIG. 21B is a graph showing the relationship between ESD stress and leak current of each terminals in a transistor after application of stress.
Figure 22:
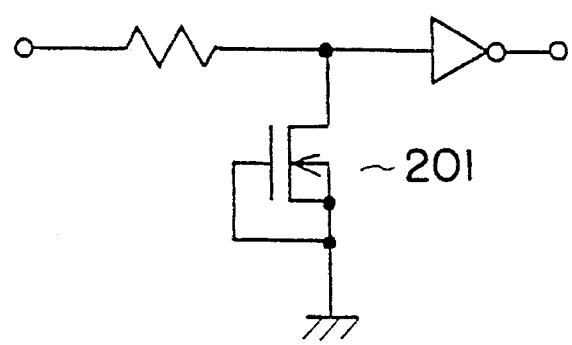
FIG. 22 is a typical block diagram showing a general protective circuit of an input-terminal.
Figure 23:
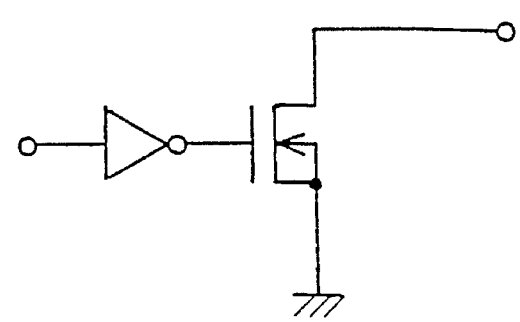
FIG. 23 is a typical block diagram showing a general N-channel open drain output terminal.
Figure 24:
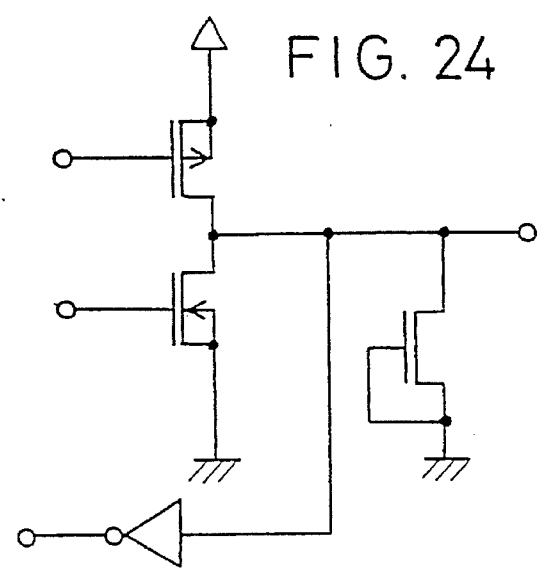
FIG. 24 is a typical block diagram showing a protective circuit of an N-channel open drain output terminal.
Figure 25:
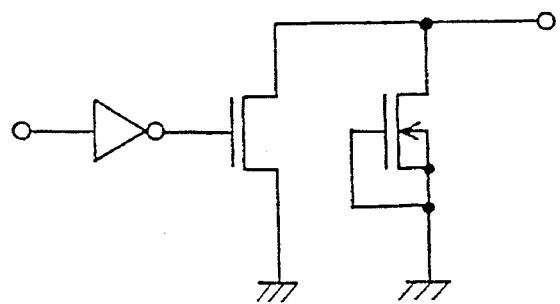
FIG. 25 is a typical block diagram showing a protective circuit of a CMOS output terminal.
Figure 26:
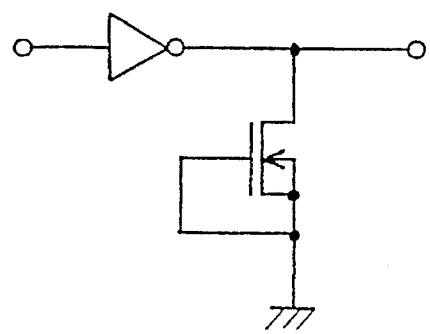
FIG. 26 is a block diagram showing a protective circuit of an input/output terminal.

FIG. 16B is a typical plan view showing the situation in which test transistor 163 is included in product IC chip 164. As the probing pads 162 are arranged like the bonding pads 161, it is useful for the measurement of Pcrit by the wafer tester explained in the third embodiment. If chip size or pad pitch is enough large, it is useful. It is useful to measure Pmax or Pcrit by sampling PCM measurement. In this case, it is no need that the probing pads are arranged at the outest side like bonding pads.

As described above, the present invention makes it possible to greatly shorten the TAT concerning to the evaluation of an ESD withstanding value by using the means in which Pmax of components of an input or output terminal of an IC (semiconductor integrated circuit) is measured at the stages of development and fabrication of a semiconductor integrated circuit substrate and it is fed back to the fabrication conditions and design rule. Moreover, the present invention provides the effects that the quality related to the ESD withstanding value is improved and the cost is decreased by using the means in which Pmax at the final stage of experimental fabrication and mass production of new products is measured and the qualification of the new products and the judgment of shipping.

What is claimed is:

1. A method for fabricating an integrated circuit comprising the steps of: providing a semiconductor substrate; forming a semiconductor integrated circuit in the semiconductor substrate; forming a component evaluation area usable for evaluation of the semiconductor integrated circuit on the same semiconductor substrate; and electrically evaluating the component evaluation area to determine the electrostatic destruction withstanding ability thereof; wherein an electrostatic destruction withstanding value evaluation element is formed in the component evaluation area and the electrical evaluation includes the step of measurement of a destruction power of the electrostatic destruction withstanding value evaluation element.

2. A method for inspecting a semiconductor integrated circuit prior to packaging of the integrated circuit comprising the steps of: providing a semiconductor substrate having a semiconductor integrated circuit and a component evaluation area usable for evaluation of the semiconductor integrated circuit on the same semiconductor substrate, the component evaluation area having an electrostatic destruction withstanding value evaluation element therein; applying various levels of voltages ranging from a nondestructive level to a destructive level to the electrostatic destruction withstanding value evaluation element and measuring the power consumed by the electrostatic destruction withstanding value evaluation element at each level of voltage applied to and current flowing through the electrostatic destruction withstanding value evaluation element; determining the power value when a highest nondestructive voltage is applied to the electrostatic destruction withstanding value evaluation element; and deciding whether or not the power value is adequate for the electrostatic destruction withstanding value of the semiconductor integrated circuit.

3. A method for inspecting a semiconductor integrated circuit according to claim 2; wherein the step of determining the power value includes the steps of stopping the voltage supply to the electrostatic destruction withstanding value evaluation element when the power reaches a prescribed value, and deciding whether or not the power is in a nondestroyed area.

4. A method for inspecting a semiconductor integrated circuit according to claim 2; wherein the step of determining the power value includes the steps of applying current to the electrostatic destruction withstanding value evaluation element; increasing the applied current at a plurality of time intervals; measuring a voltage of the electrostatic destruction withstanding value evaluation element at each respective time interval; and calculating corresponding power levels at each respective time interval.

5. A method for inspecting a semiconductor integrated circuit according to claim 2; wherein the step of determining the power value includes the steps of applying current to the electrostatic destruction withstanding value evaluation element; increasing the applied current logarithmically at predetermined time intervals; measuring a corresponding voltage at each respective time interval; and obtaining corresponding power levels at each respective time interval.

6. A method for fabricating a semiconductor integrated circuit comprising the steps of: providing a semiconductor substrate; forming a semiconductor integrated circuit on the substrate; and electrically inspecting the semiconductor integrated circuit by measuring the destroy power of a device in the integrated circuit and determining therefrom the electrostatic destroy withstanding value of the integrated circuit.

7. A method for inspecting a semiconductor integrated circuit comprising the steps of: applying a voltage to a single device of a semiconductor integrated circuit; measuring the power consumed by the device; stopping the supply of voltage at a power value less than a maximum destroy power; and determining whether or not said power value is in a nondestroyed area; whereby testing of the integrated circuit may be performed prior to packaging thereof.

8. A method for inspecting a semiconductor integrated circuit according to claim 7; wherein the step of measuring the power includes the steps of applying current to the device; increasing the current supply to the device at each of a plurality of time intervals; measuring a corresponding voltage across the device at each respective time interval; and determining corresponding power levels at each respective time interval.

9. A method for inspecting a semiconductor integrated circuit according to claim 7; wherein the step of measuring the power includes the steps of applying current to the device; logarithmically increasing the current supply to the device at each of a plurality of time intervals; measuring a corresponding voltage across the device at each respective time interval; and determining corresponding power levels at each respective time interval.

* * * * *